United States Patent
Kim et al.

(10) Patent No.: US 9,202,968 B2
(45) Date of Patent: Dec. 1, 2015

(54) METHOD OF FABRICATING VERTICAL LIGHT EMITTING DIODE

(71) Applicant: SEOUL VIOSYS CO., LTD., Ansan-si (KR)

(72) Inventors: Chang Yeon Kim, Ansan-si (KR); Tae Kyoon Kim, Ansan-si (KR); Tae Hyuk Im, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 21 days.

(21) Appl. No.: 14/083,856

(22) Filed: Nov. 19, 2013

(65) Prior Publication Data

US 2014/0147946 A1    May 29, 2014

(30) Foreign Application Priority Data

Nov. 23, 2012 (KR) .......................... 10-2012-0133787

(51) Int. Cl.
  *H01L 21/00* (2006.01)
  *H01L 33/00* (2010.01)

(52) U.S. Cl.
  CPC .................... *H01L 33/0079* (2013.01)

(58) Field of Classification Search
  CPC ............ H01L 33/0079; H01L 33/0062; H01L 29/861; H01L 29/8611
  See application file for complete search history.

(56) References Cited

U.S. PATENT DOCUMENTS

| | | | | |
|---|---|---|---|---|
| 2002/0177247 A1* | 11/2002 | Kwak et al. | ..................... | 438/22 |
| 2012/0012871 A1* | 1/2012 | Hsia et al. | ........................ | 257/98 |
| 2012/0064642 A1* | 3/2012 | Huang et al. | .................... | 438/15 |

FOREIGN PATENT DOCUMENTS

KR   10-2012-0099544        9/2012

* cited by examiner

*Primary Examiner* — Thanh Y Tran
(74) *Attorney, Agent, or Firm* — H.C. Park & Associates, PLC

(57) ABSTRACT

Provided is a method of fabricating a vertical light emitting diode (LED). Initially, a semiconductor structure layer including an active layer is formed on a front surface of a growth substrate. A conductive support substrate is formed on the semiconductor structure layer. A rear surface of the growth substrate is abraded to reduce the thickness of the growth substrate. The rear surface of the growth substrate whose thickness is reduced due to the abrasion is dry etched to remove the growth substrate.

10 Claims, 3 Drawing Sheets

METHOD OF FABRICATING VERTICAL LIGHT EMITTING DIODE

CROSS REFERENCE TO RELATED APPLICATION

This application claims priority from and the benefit of Korean Patent Application No. 10-2012-0133787, filed on Nov. 23, 2012, in which is hereby incorporated by reference for all purposes as if fully set forth herein.

BACKGROUND

1. Field

Example embodiments of the present invention relate in general to the field of semiconductor devices and more specifically to light emitting diodes (LEDs).

2. Discussion of the Background

A light emitting diode (LED) is basically a PN junction diode including a junction between a P-type semiconductor and an N-type semiconductor.

In the LED, after the junction between the P-type semiconductor and the N-type semiconductor is formed, when a voltage is applied to the P-type semiconductor and the N-type semiconductor and a current flows, holes of the P-type semiconductor may move toward the N-type semiconductor, and electrons of the N-type semiconductor may move toward the P-type semiconductor, so the electrons and the holes may move to a PN junction portion.

The electrons, which have moved to the PN junction portion, may be dropped from a conduction band to a valence band and combined with the holes. In this case, energy corresponding to a height difference (i.e., energy difference) between the conduction band and the valence band may be emitted in the form of beams.

The LED is a light emitting semiconductor device, which may be environmentally friendly and characterized by a low voltage, a long lifespan, and a low price. Although conventional LEDs have mainly been applied to display lamps or devices configured to display simple information, such as numbers, the latest LEDs are being used in a wide variety of fields, such as displays, automobile head lamps, and projectors, with the development of industrial technology, particularly, the development of information display technology and semiconductor technology.

LEDs may include horizontal LEDs and vertical LEDs. A vertical LED exhibits better current dispersion performance than a horizontal LED. Also, the horizontal LED uses a growth substrate, such as a sapphire substrate, as a support substrate, while the vertical LED uses a substrate, such as a metal substrate having a high thermal conductivity, and exhibits excellent heat emission performance.

A method of fabricating the vertical LED includes growing a GaN epitaxial layer using a sapphire substrate, and isolating the GaN epitaxial layer from the sapphire substrate using a laser liftoff (LLO) process (Korean Patent Publication No. 2012-0099544).

When an epitaxial layer is grown on a heterogeneous substrate, such as a sapphire substrate, a lot of defects caused by a mismatch in a coefficient of thermal expansion and a lattice mismatch may occur in the epitaxial layer. Thus, there have been attempts to grow an epitaxial layer on a homogeneous substrate. However, since there is no or little difference in bandgap energy between the homogeneous substrate and the epitaxial layer, it is difficult to apply an LLO process to isolate the epitaxial layer from the substrate to fabricate a vertical LED.

SUMMARY OF THE INVENTION

Example embodiments of the present invention provide a method of fabricating a vertical light emitting diode (LED), which may reduce occurrence of failures during the removal of a homogeneous growth substrate after growing an epitaxial layer on the homogeneous growth substrate.

In some example embodiments, a method of fabricating an LED includes forming a semiconductor structure layer including an active layer on a front surface of a growth substrate. A conductive support substrate is formed on the semiconductor structure layer. A rear surface of the growth substrate is abraded to reduce a thickness of the growth substrate. The rear surface of the growth substrate whose thickness is reduced due to the abrasion is dry etched to remove the growth substrate.

In other example embodiments, a method of fabricating an LED includes forming a semiconductor structure layer including an active layer on a front surface of a growth substrate. A conductive support substrate is formed on the semiconductor structure layer. A warpage compensation support substrate is bonded onto the conductive support substrate. The growth substrate is removed with the warpage compensation support substrate bonded onto the conductive support substrate.

BRIEF DESCRIPTION OF THE DRAWINGS

Example embodiments of the present invention will become more apparent by describing in detail example embodiments of the present invention with reference to the accompanying drawings, in which.

DETAILED DESCRIPTION OF THE ILLUSTRATED EMBODIMENTS

Figure 1A:
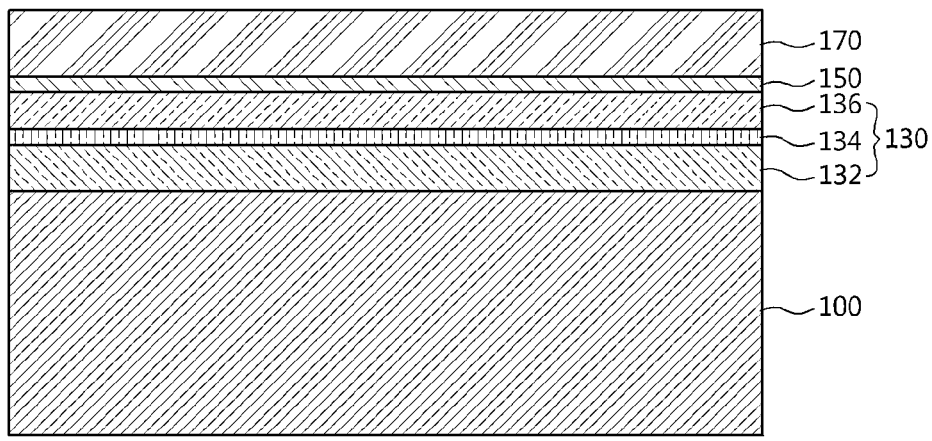
FIGS. 1A through 1F are cross-sectional views illustrating a method of fabricating a light emitting diode (LED) according to embodiments of the inventive concept.

Example embodiments of the present invention are disclosed herein. However, specific structural and functional details disclosed herein are merely representative for purposes of describing example embodiments of the present invention, and thus example embodiments of the present invention may be embodied in many alternative forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when a layer is referred to as being "on" another layer or substrate, it can be directly on the other layer or substrate or intervening layers may also be present. Terms that describe spatial relationships, such as "beneath," "below," "lower," "above," "upper," and the like, may be used herein for ease of description to describe one element or feature's relationship to another element(s) or feature(s) as illustrated in the figures. It will be understood that such terms are intended to encompass different orientations of the device in use or operation in addition to the orientation(s) depicted in the figures. For example, if the device in the figures is turned over, elements described as "below" or "beneath" other elements or features would then be oriented "above" the other elements or features. Thus, the term "below" can encompass both an orientation of above and below. It will be understood that, although the terms first, second, etc. may be used herein to describe various elements, components, regions, layers, and/or sections, these elements, components, regions, layers, and/or sections should not be limited by these terms.

In the drawings, the thicknesses of layers and regions are exaggerated for clarity. Like numbers refer to like elements throughout.

FIGS. 1A through 1F are cross-sectional views illustrating a method of fabricating a light emitting diode (LED) according to embodiments of the inventive concept.

Referring to FIG. 1A, a first-conductivity-type clad layer 132 may be formed on a growth substrate 100. An active layer 134 and a second-conductivity-type clad layer 136 may be sequentially formed on the first-conductivity-type clad layer 132. The first-conductivity-type clad layer 132, the active layer 134, and the second-conductivity-type clad layer 136 may form a light emitting structure layer 130.

The growth substrate 100 may be a substrate of the same kind as the light emitting structure layer 130, for example, a nitride-based substrate. Specifically, the growth substrate 100 may be a gallium nitride (GaN) substrate, an indium gallium nitride (InGaN) substrate, an aluminum gallium nitride (AlGaN) substrate, or an aluminum nitride (AlN) substrate. More specifically, the growth substrate 100 may be a GaN substrate.

The first-conductivity-type clad layer 132 may be a nitride-based semiconductor layer, which may be doped with an n-type dopant. In an example, the first-conductivity-type clad layer 132 may be an $In_xAl_yGa_{1-x-y}N$ layer ($0 \leq x \leq 1$, $0 \leq y \leq 1$, $x+y \leq 1$), which may be doped with silicon (Si) as an n-type dopant. Specifically, the first-conductivity-type clad layer 132 may be a GaN layer doped with Si. In another case, the first-conductivity-type clad layer 132 may include a plurality of $In_xAl_yGa_{1-x-y}N$ layers ($0 \leq x \leq 1$, $0 \leq y \leq 1$, $x+y \leq 1$) having different compositions. When the growth substrate 100 is a GaN substrate and the first-conductivity-type clad layer 132 is a GaN layer, a high-quality first-conductivity-type clad layer 132 having few lattice defects may be obtained as compared with a case in which a heterogeneous growth substrate 100 is used.

The active layer 134 may be an $In_xAl_yGa_{1-x-y}N$ layer ($0 \leq x \leq 1$, $0 \leq y \leq 1$, $0 \leq x+y \leq 1$) and have a single quantum well (SQW) structure or a multiple quantum well (MQW) structure. In an example, the active layer 134 may have an SQW structure including an InGaN layer or an AlGaN layer or an MQW structure including a multilayered structure, such as InGaN/GaN, AlGaN/(In)GaN, or InAlGaN/(In)GaN.

The second-conductivity-type clad layer 136 also may be a nitride-based semiconductor layer, which may be doped with a p-type dopant. In an example, the second-conductivity-type clad layer 136 may be an $In_xAl_yGa_{1-x-y}N$ layer ($0 \leq x \leq 1$, $0 \leq y \leq 1$, $0 \leq x+y \leq 1$) doped with magnesium (Mg) or zinc (Zn) as a p-type dopant. Specifically, the second-conductivity-type clad layer 136 may be a GaN layer doped with Mg. In another case, the second-conductivity-type clad layer 136 may include a plurality of $In_xAl_yGa_{1-x-y}N$ layers ($0 \leq x \leq 1$, $0 \leq y \leq 1$, $0 \leq x+y \leq 1$) having different compositions. The first-conductivity-type clad layer 132, the active layer 134, and the second-conductivity-type clad layer 136 may be formed using a metal organic chemical vapor deposition (MOCVD) process or a molecular beam epitaxy (MBE) process.

Before forming the first-conductivity-type clad layer 132, a buffer layer (not shown) may be formed on the growth substrate 100. The buffer layer may be an $Al_xGa_{1-x}N$ layer ($0 \leq x \leq 1$). When the growth substrate 100 is a GaN substrate and the first-conductivity-type clad layer 132 is a GaN layer, the buffer layer may be omitted.

An ohmic contact layer 150 may be formed on the second-conductivity-type clad layer 136 to form ohmic contact with the second-conductivity-type clad layer 136. To this end, a conductive layer may be stacked on the second-conductivity-type clad layer 136 and annealed. The ohmic contact layer 150 may be a platinum (Pt) layer, a Pt alloy layer, a nickel (Ni) layer, a Ni alloy layer, or a stacked layer thereof.

A conductive support substrate 170 may be bonded onto the ohmic contact layer 150. Before bonding the conductive support substrate 170, a bonding layer, such as a thermocompressive bonding layer or a eutectic bonding layer, may be formed between the ohmic contact layer 150 and the conductive support substrate 170. The conductive support substrate 170 may be a semiconductor substrate formed of, for example, Si, GaAs, GaP, or InP, or a metal substrate formed of, for example, Cu or W. In another case, the conductive support substrate 170 may be a plating substrate formed on the ohmic contact layer 150 using an electroplating process.

Figure 1B:
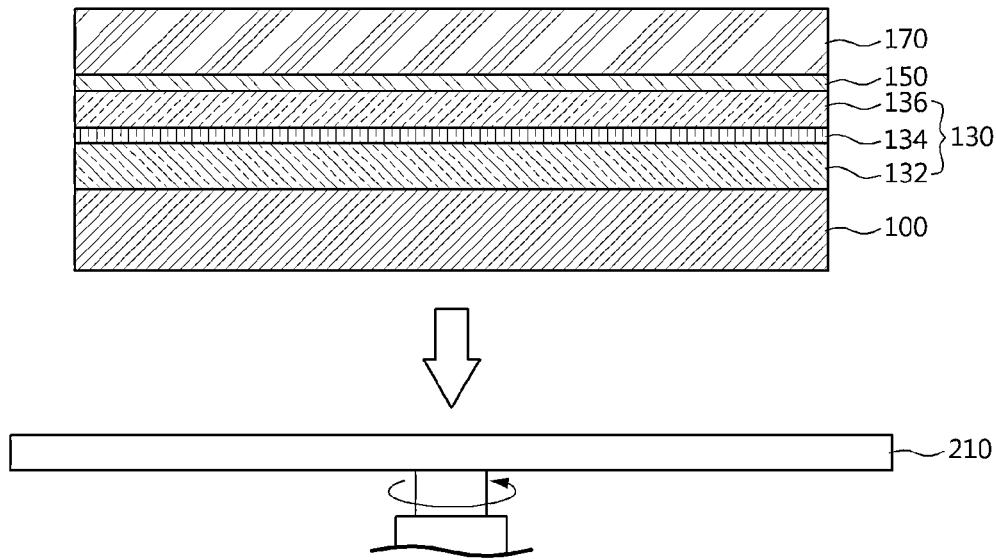
Figure 1C:
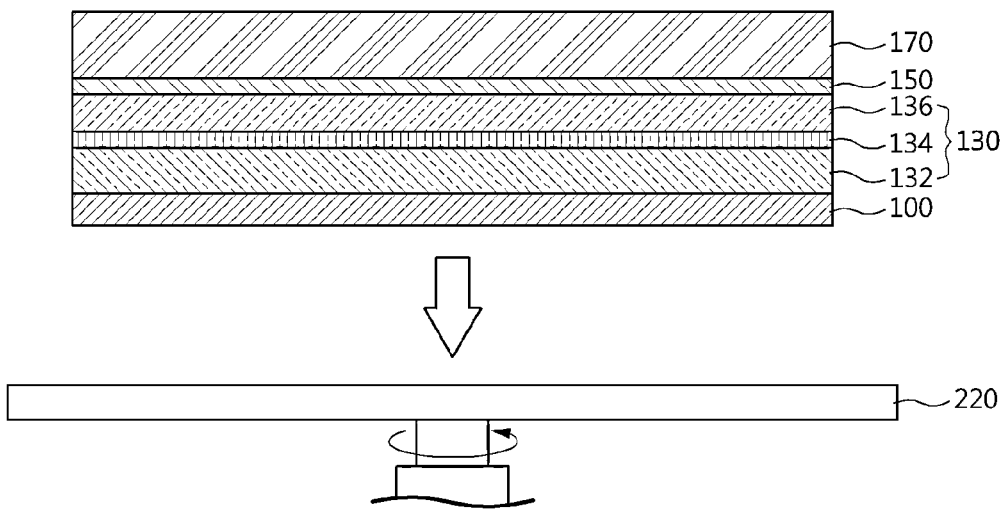

Referring to FIGS. 1B and 1C, a rear surface of the growth substrate 100 may be abraded using frictional force to reduce the thickness of the growth substrate 100. The abrasion of the rear surface of the growth substrate 100 may be performed using an abrasion pad (refer to 210 in FIG. 1B or 220 in FIG. 1C). An abrasive may be coated between the growth substrate 100 and the abrasion pad (refer to 210 in FIG. 1B or 220 in FIG. 1C).

The abrasion process may include two steps having different abrasion speeds. In an example, the abrasion process may include a grinding step and a lapping step. The grinding step is an example of a first abrasion step having a high abrasion speed, and the lapping step is an example of a second abrasion step having a low abrasion speed. Also, after the grinding step (refer to FIG. 1B) is performed, the lapping step (refer to FIG. 1C) may be performed. An abrasion pad (i.e., grinding pad (refer to 210 in FIG. 1B)) used in the grinding step may have a higher surface roughness than an abrasion pad (i.e., lapping pad (refer to 220 in FIG. 1C)) used in the lapping step. Also, different abrasives may be used in the grinding step and the lapping step.

When the abrasion process includes two steps, an abrasion speed of the rear surface of the growth substrate 100 may be efficiently controlled. Also, a thickness of the growth substrate 100, which may be remained after the abrasion process is ended, may be easily controlled. In an example, after the abrasion process is ended, the remaining thickness of the growth substrate 100 may range from about 5 µm to about 20 µm, specifically, about 10 µm to about 15 µm. Thus, when the growth substrate 100 is abraded to a very small thickness, the resultant structure including the growth substrate 100 and the light emitting structure layer 130 may be bent due to a mismatch in a coefficient of thermal expansion between the light emitting structure layer 130 and the conductive support substrate 170. Also, since an extent to which the resultant structure is bent during the abrasion process gradually increases, there may be a difference in the remaining thickness between central and edge portions of the growth substrate 100. Such a thickness deviation may lead to occurrence of device failures. Accordingly, the abrasion process may be interrupted before an excessive difference in thickness between the central and edge portions of the growth substrate 100 occurs due to severe warpage.

Figure 2:
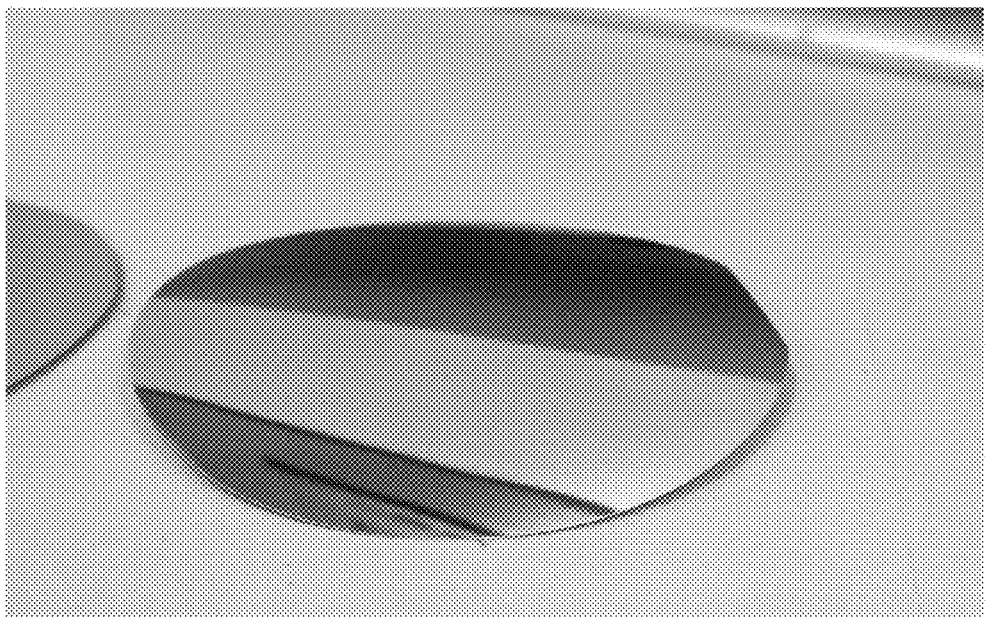
FIG. 2 is an image of a wafer, which is captured after an abrasion process is completed.

FIG. 2 is an image of a wafer captured after an abrasion process is ended. Referring to FIG. 2, it can be observed that the wafer has warped.

Figure 1D:
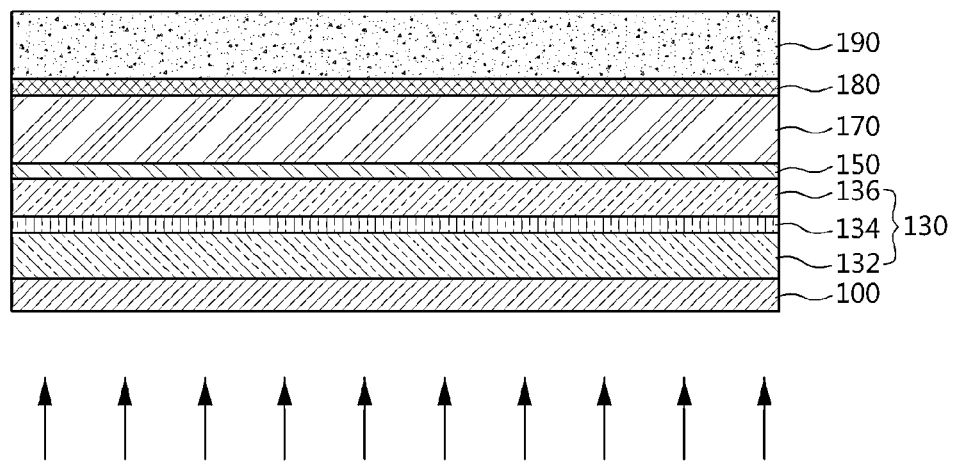

Referring to FIG. 1D, a warpage compensation support substrate 190 may be bonded onto the conductive support substrate 170. By bonding the warpage compensation support substrate 190, the warped resultant structure including the growth substrate 100 and the light emitting structure layer 130 may flatten again. As a result, a thickness deviation may be minimized during a subsequent process of removing the growth substrate 100. The warpage compensation support substrate 190 may be any substrate having an appropriate rigidity. In an example, the warpage compensation support substrate 190 may be a sapphire substrate. To bond the warpage compensation support substrate 190 onto the conductive support substrate 170, an adhesive sheet 180 may be inserted between the warpage compensation support substrate 190 and the conductive support substrate 170. The adhesive sheet 180 may be a thermally stable and highly adhesive sheet, for example, a heat-resistant adhesive sheet.

Thereafter, the remaining portion of the growth substrate 100 may be dry etched using a plasma process, which is an example of a dry etching process. Since the surface of the growth substrate 100 may be precisely etched due to the dry etching process, after the dry etching process is performed, the growth substrate 100 may be completely removed, and a difference in thickness between the central and edge portions of the growth substrate 100 may be minimized.

In this case, since the light emitting structure layer 130 and the growth substrate 100 are formed of the same material, an etch stop point may not be recognized. To recognize the etch stop point, a surface current of the surface exposed due to the dry etching process may be measured. When the light emitting structure layer 130 is completely exposed, that is, when the growth substrate 100 is completely removed, the surface current may sharply rise and the etch stop point may be recognized.

Figure 1E:
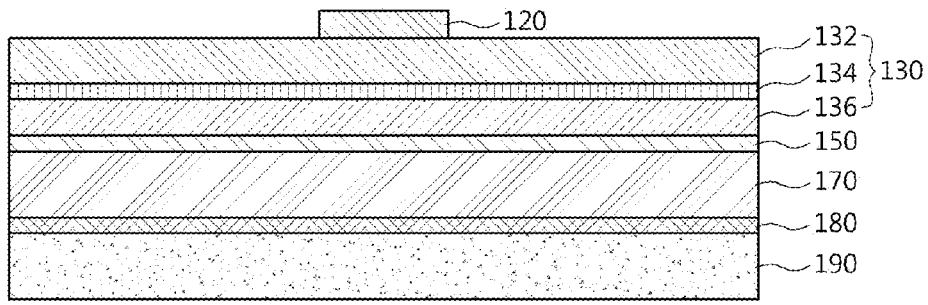

Referring to FIG. 1E, a first electrode 120 may be formed on the first-conductivity-type clad layer 132 exposed by removing the growth substrate 100. The first electrode 120 may include an Al layer, a Pt layer, a Ni layer, or a gold (Au) layer.

Figure 1F:
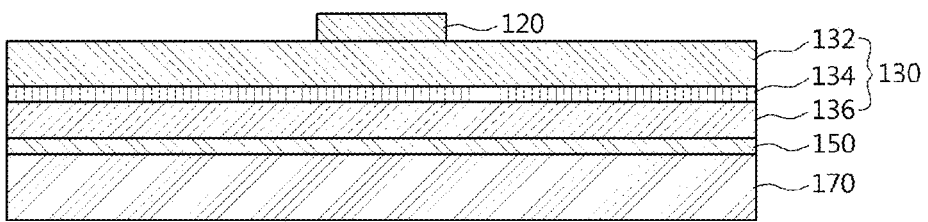

Referring to FIG. 1F, the warpage compensation support substrate 190 may be removed to expose the conductive support substrate 170. To this end, the adhesive sheet 180 may be selectively wet etched. The exposed conductive support substrate 170 may serve as a second electrode.

According to the present invention, a growth substrate can be removed by performing both an abrasion step and a dry etching step. In this case, the abrasion step can be performed at a high etch rate, while an etch rate of the dry etching step can be precisely controlled. Thus, a difference in thickness between central and edge portions of the remaining growth substrate in the resultant structure can be greatly reduced. As a result, device failures due to a thickness deviation can be greatly reduced. Also, the thickness deviation can be further reduced using a warpage compensation support substrate.

While the example embodiments of the present invention and their advantages have been described in detail, it should be understood that various changes, substitutions, and alterations may be made herein without departing from the scope of the invention.

What is claimed is:

1. A method of fabricating a light emitting diode (LED), the method comprising:
   forming a semiconductor structure layer on a first surface of a growth substrate, the semiconductor structure layer comprising an active layer;
   forming a conductive support substrate on the semiconductor structure layer;
   abrading a second surface of the growth substrate;
   dry etching the second surface of the growth substrate, after abrading the second surface of the growth substrate; and
   forming a warpage compensation support substrate on the conductive support substrate after abrading the second surface of the growth substrate and before dry etching the second surface of the growth substrate.

2. The method of claim 1, wherein abrading the second surface of the growth substrate comprises a first abrading and a second abrading performed at a lower abrasion speed than the first abrading.

3. The method of claim 2, wherein the first abrading comprises grinding, and the second abrading comprises lapping.

4. The method of claim 3, wherein an abrasion speed of the first abrading is greater than an abrasion speed of the second abrading.

5. The method of claim 1, wherein dry etching the second surface of the growth substrate is performed using plasma.

6. The method of claim 1, further comprising forming an adhesive sheet on the conductive support substrate before forming the warpage compensation support substrate on the conductive support substrate.

7. The method of claim 1, further comprising removing the warpage compensation support substrate after dry etching the second surface of the growth substrate.

8. The method of claim 1, wherein after abrading, the growth substrate comprises a thickness in the range of 5 μm to 20 μm.

9. The method of claim 8, wherein after abrading, the growth substrate comprises a thickness in the range of 10 μm to 15 μm.

10. The method of claim 1, wherein an etch rate of abrading is greater than an etch rate of dry etching.

* * * * *